US008866024B1

(12) United States Patent
Liu et al.

(10) Patent No.: US 8,866,024 B1
(45) Date of Patent: Oct. 21, 2014

(54) TRANSCEIVER POWER DISTRIBUTION NETWORK

(75) Inventors: Hui Liu, Pleasanton, CA (US); Zhe Li, San Jose, CA (US)

(73) Assignee: Altera Corporation, San Jose, CA (US)

( * ) Notice: Subject to any disclaimer, the term of this patent is extended or adjusted under 35 U.S.C. 154(b) by 330 days.

(21) Appl. No.: 13/531,217

(22) Filed: Jun. 22, 2012

(51) Int. Cl.
*H05K 1/03* (2006.01)
*H05K 1/09* (2006.01)
*H05K 1/11* (2006.01)

(52) U.S. Cl.
CPC .................................... *H05K 1/116* (2013.01)
USPC ............ 174/261; 174/255; 174/257; 174/264

(58) Field of Classification Search
USPC .................. 174/255, 257, 261, 264
See application file for complete search history.

(56) References Cited

U.S. PATENT DOCUMENTS

| | | | |
|---|---|---|---|
| 7,838,337 B2* | 11/2010 | Marimuthu et al. .......... 438/110 |
| 7,944,041 B2* | 5/2011 | Conn ............................. 257/691 |
| 8,022,532 B2* | 9/2011 | Kasuya et al. ................ 257/707 |
| 8,035,992 B2* | 10/2011 | Kushta et al. ................. 361/818 |
| 8,143,704 B2* | 3/2012 | West .............................. 257/621 |
| 8,405,420 B2* | 3/2013 | Or-Bach et al. ................. 326/41 |
| 2011/0037169 A1* | 2/2011 | Pagaila .......................... 257/737 |
| 2011/0156226 A1* | 6/2011 | Kasuya et al. ................ 257/675 |
| 2012/0061814 A1* | 3/2012 | Camacho et al. ............. 257/676 |
| 2012/0217653 A1* | 8/2012 | Takemura et al. ............ 257/774 |
| 2012/0228760 A1* | 9/2012 | Lim et al. ...................... 257/737 |
| 2012/0261178 A1* | 10/2012 | Kusumoto et al. ............ 174/262 |
| 2012/0305916 A1* | 12/2012 | Liu et al. ......................... 257/48 |
| 2013/0020675 A1* | 1/2013 | Kireev et al. ................. 257/531 |
| 2013/0070437 A1* | 3/2013 | Mohammed et al. ......... 361/767 |
| 2013/0157639 A1* | 6/2013 | Huppenthal et al. .......... 455/418 |
| 2014/0073087 A1* | 3/2014 | Huang et al. .................. 438/107 |
| 2014/0145326 A1* | 5/2014 | Lin et al. ....................... 257/737 |

* cited by examiner

*Primary Examiner* — Jeremy C Norris
*Assistant Examiner* — Nathan Milakovich
(74) *Attorney, Agent, or Firm* — Ward & Zinna, LLC

(57) ABSTRACT

A power distribution network comprises an interposer and a package substrate, each of which has a major upper surface and a major lower surface substantially parallel to the upper surface. A single copper island is formed on the lower surface of the interposer opposite and substantially co-extensive with a single copper island formed on the upper surface of the package substrate. A plurality of leads extend from the copper island on the lower surface of the interposer, each lead coupling to a different silicon through via that extends through the interposer to the upper surface of the interposer. This structure has significant improvements in performance and cost over prior art structures.

20 Claims, 3 Drawing Sheets

US 8,866,024 B1

TRANSCEIVER POWER DISTRIBUTION NETWORK

BACKGROUND

This relates to a power distribution network.

A conventional power distribution network may include an interposer mounted on a package substrate. Electrical and mechanical connections between the interposer and the package substrate are provided by a plurality of copper islands on a lower surface of the interposer, a copper island on an upper surface of substrate opposite the copper islands on the lower surface of the interposer, and solder balls or solder bumps connecting the copper islands on the interposer to the copper island on the substrate.

Through silicon vias (TSV) may extend through the interposer between the copper islands on the lower surface to contact pads on an upper surface of the interposer. Microvias (uVIA) may extend into the package substrate from the upper surface and connect to metal layers in the package substrate. These metal layers are connected by other microvias to still other metal layers or to a lower surface of the package substrate. The microvias and metal layers define electrical interconnection paths that connect the copper island on the upper surface of the package substrate to one or more surface connectors on the lower surface of the package substrate.

Unfortunately, this conventional power distribution network may have a high impedance peak and high Q factor which result in high power noise. The high power noise leads to undesirable high jitter at frequencies over 50 GigaHertz (GHz). The conventional power distribution network described above may also lead to high cost in terms of solder balls or bumps since there is a ball or bump for each power channel, lost space on the interposer and the package substrate that is used for the copper islands and/or lost area that is required for die capacitors.

SUMMARY

The present invention is an improved power distribution network in an interposer and package substrate structure.

In an illustrative embodiment, the structure comprises an interposer and a package substrate, each of which has a major upper surface and a major lower surface substantially parallel to the upper surface. A single copper island is formed on the lower surface of the interposer opposite and substantially co-extensive with a single copper island formed on the upper surface of the package substrate. A plurality of leads extends from the copper island on the lower surface of the interposer forming a damping and isolation bridge. Each lead couples to a different TSV that extends through the interposer to the upper surface of the interposer. This structure reduces the number of balls or bumps needed to connect the interposer and the package substrate, allows for reduction in the size of the copper islands, and reduces the self-impedance and transfer impedance of the power distribution network.

Numerous variations may be practiced in the invention.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1A:
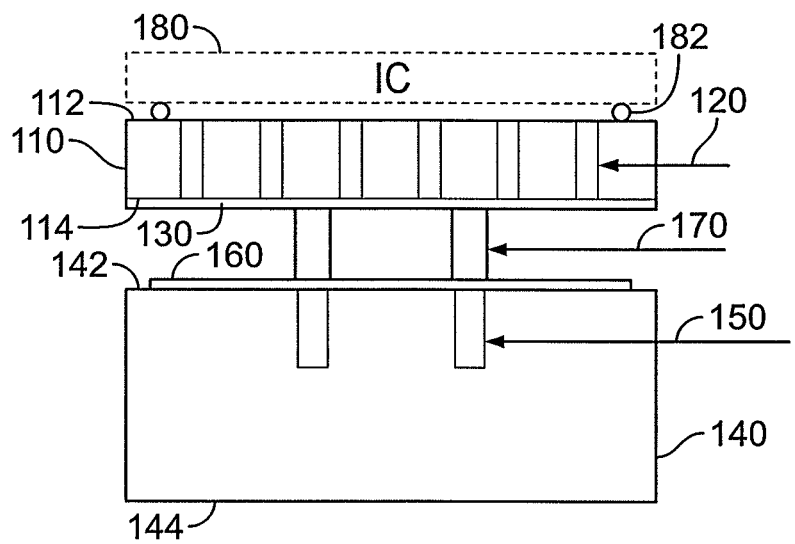
FIGS. 1A-1D are views of an illustrative embodiment of a power distribution network for an interposer and package structure of the present invention.
Figure 1B:
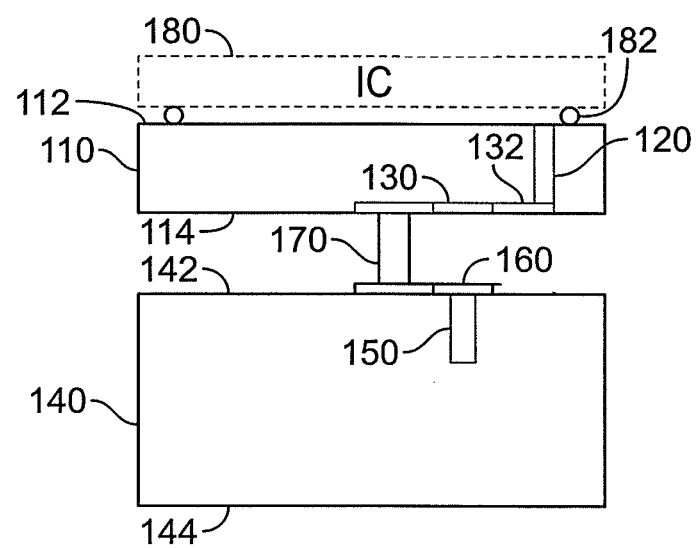
Figure 1C:
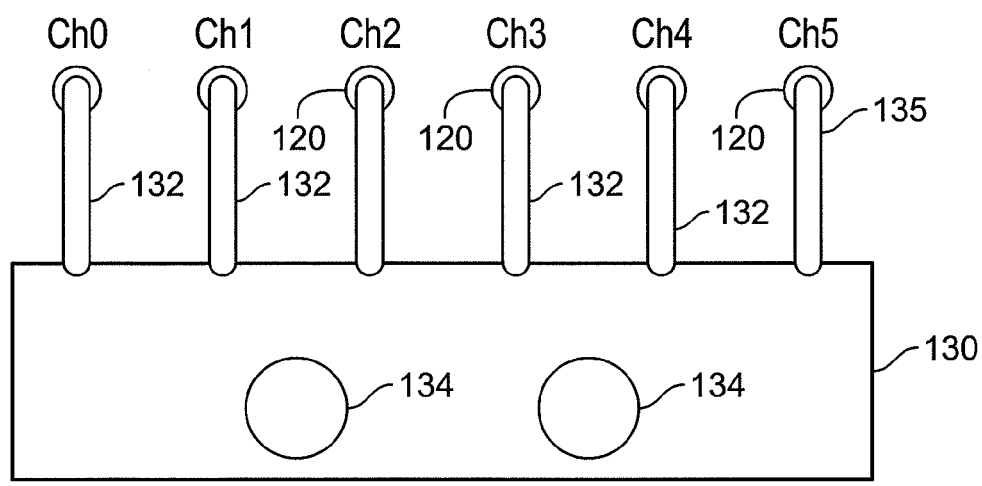
Figure 1D:
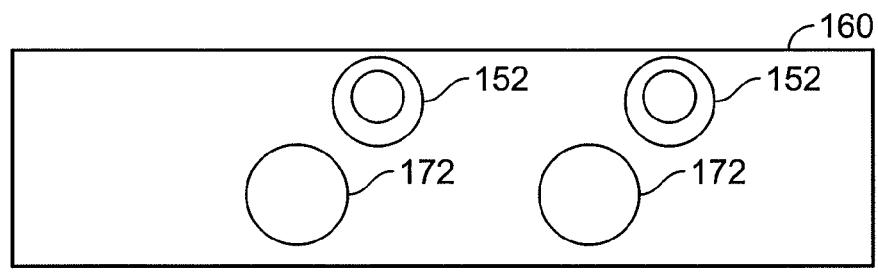

FIGS. 1A-1D depict an illustrative example of a power distribution network of the present invention formed in an interposer and a package substrate structure. FIG. 1A is a side view of the structure; and FIG. 1B is an end-on view of the same structure. FIG. 1C depicts the lower layer on the interposer; and FIG. 1D depicts the upper layer on the package substrate.

As shown in FIG. 1A, the structure comprises an interposer 110 mounted on a package substrate 140. Illustratively, the interposer is made of silicon and the package substrate is made of FR4 or BT resin. The interposer has a major upper surface 112 and a major lower surface 114 that is substantially parallel to upper surface 112; and the package substrate has a major upper surface 142 and a major lower surface 144 that is substantially parallel to upper surface 142. Electrical and mechanical connections between the interposer and the package substrate are provided by a single copper island 130 on lower surface 114 of interposer 110, a copper island 160 on upper surface 142 of substrate 140, and bumps 170 connecting the copper island 130 to the copper island 160, as shown in FIG. 1B. When interposer 110 is mounted on package substrate 140, copper island 130 is opposite copper island 160 and is substantially co-terminous with it.

As shown in FIG. 1A, through silicon vias (TSV) 120 extend through interposer 110 between lower surface 114 to contact pads (not shown) on upper surface 112. Leads 132 shown in FIGS. 1B and 1C extend from copper island 130 to each of the TSVs 120. Microvias (uVIA) 150 extend into package substrate from copper island 160 on upper surface 142. Typically, the microvias connect to metal layers (not shown) in the package substrate; and these metal layers are connected by other microvias (not shown) to still other metal layers or to lower surface 144. The microvias and metal layers define electrical interconnection paths that connect copper island 160 to one or more connectors on lower surface 144.

Illustratively, an integrated circuit (IC) 180 is mounted on interposer 110 in a flip-chip arrangement with a ball grid array 182 that provides electrical and mechanical connection between the integrated circuit 180 and the contact pads on upper surface 112.

As shown in FIG. 1B, illustratively a single row (or column) of bumps 170 is used to provide the power connections between the package substrate 140 and the interposer 110. Alternatively, additional rows (or columns) of bumps may also be used. Illustratively, the bumps are C4 (controlled collapse chip connection) bumps; but other types of connectors may be used in place of the C4 bumps. For convenience, the term "bumps" will be understood to refer to all types of solder balls, solder bumps, studs, pillars and the like performing similar functions.

FIG. 1C depicts a portion of lower surface 114 of interposer 110. A single copper island 130 connects to several power channels Ch0-Ch5 that extend through interposer 110 in the form of TSVs 120. Copper island 130 is a continuous layer extending in two-dimensions on lower surface 114. A plurality of leads 132 extend from copper island 130 to form a damping and isolation bridge 135 in which a different lead connects to each of the TSVs 120. In one embodiment, each lead is a metal trace on lower surface 114. As is apparent in FIG. 1C, damping and isolation bridge 135 has the appearance of a comb. We have found that the length L of the comb structure of bridge 135 (the distance between the first and last leads 132) divided by the width W of the comb structure (the distance between the TSVs and the copper island) should be at least five to achieve the performance improvements described below. Copper island 130 further comprises at least one bump pad 134 for connecting to one of the bumps 170. For purposes of illustration, we have shown two bump pads 134 in FIG. 1C. In general, we have found that the number of bumps that are used can be substantially fewer than the number of power channels connected to the copper island 130. As a result, the total area taken up by copper island 130 can be substantially smaller than the total area taken up by the copper islands on the lower surface of the interposer in a conventional power distribution network. This can produce a savings of more than 50 percent (%) in the area formerly allocated to the copper islands.

FIG. 1D depicts a portion of upper surface 142 of package substrate 140 on which is formed copper island 160. Copper island 160 is a continuous layer extending in two dimensions on upper surface 142. Copper island 160 includes one or more contact areas 152 to connect to microvias that extend into substrate 140 and eventually connect to lower surface 144 of substrate 140. Copper island 160 also includes enough bump pads 172. that each bump 170 connects to a different bump pad 172. In the example illustrated in FIGS. 1A-1D, there are two bump pads 172 in copper island 160. Since copper island 160 preferably is co-terminous with copper island 130, its area can also be reduced by more than 50% compared to the area of copper island 60.

The design of a power distribution network is based on equation (1) for the impedance peak and equation (2) for the Q factor.

$$Z{peak}=(L/C)/R \tag{1}$$

$$Q=\mathrm{sqrt}(L/C)/R \tag{2}$$

Inductance L is mostly from the package substrate while capacitance C and resistance R are mostly from the die. The smaller the Zpeak and Q are the better the power distribution network is.

Figure 2:
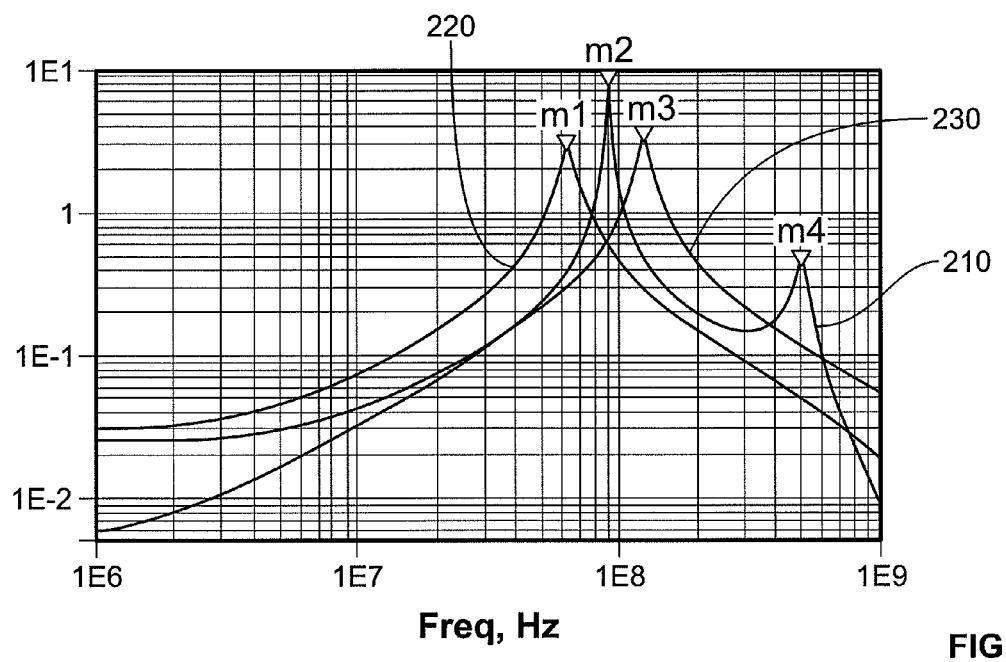
FIGS. 2 and 3 are plots depicting the performance of two implementations of the structure of FIGS. 1A-1D compared to a conventional structure.
Figure 3:
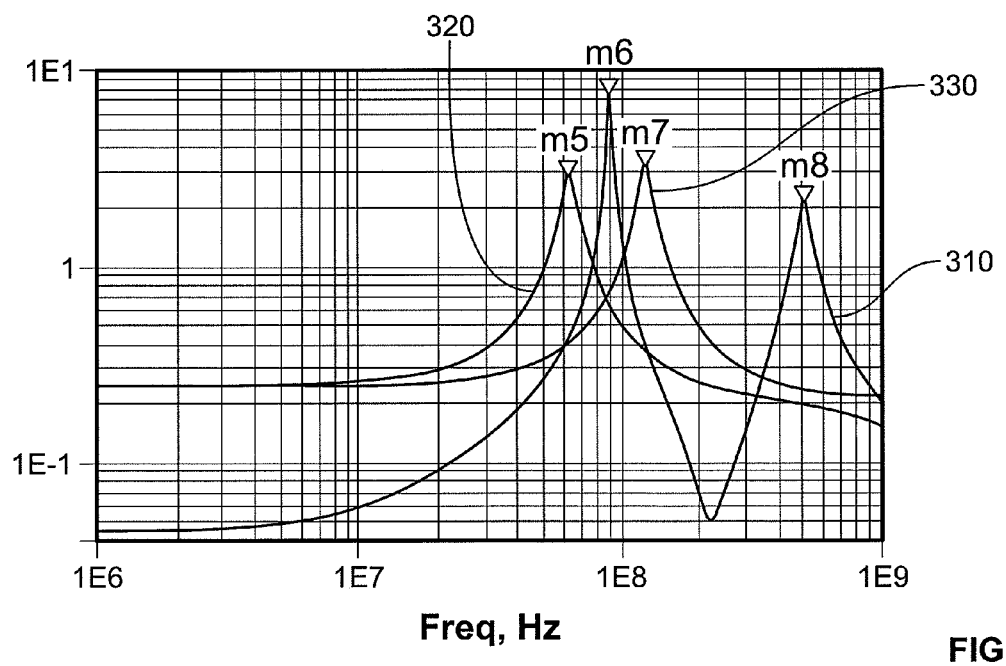

FIG. 2 depicts the transfer impedance versus frequency for a prior art device (plot 210) and for two devices (plots 220, 230) made in accordance with the invention. FIG. 3 depicts the self-impedance versus frequency for the prior art device (plot 310) and the same two devices (plots 320, 330) made in accordance with the invention.

As can be seen, the prior art device has a peak transfer impedance and a peak self-impedance that are both significantly higher than the peak transfer impedance and peak self-impedance of the two devices made in accordance with the invention. In addition, the prior art device has a second peak that is believed to be caused by inadequate isolation.

The following table summarizes the cost and performance comparison between the prior art device and two embodiments of the present invention:

As can be seen, while the peak transfer impedance of the prior art device is 7.38 Ohms, the peak transfer impedance of the two embodiments of the invention are 2.63 and 2.98 Ohms, representing reductions of 64% and 60%, respectively. Likewise, while the peak self-impedance of the prior art device is 7.42 Ohms, the peak self-impedances of the two embodiments of the invention are 2.85 and 3.19 Ohms, representing reductions of 62% and 57%, respectively. At the same time, these performance improvements are achieved while reducing the number of bumps from 6 to 2 which significantly reduces manufacturing costs and conserves space on the package substrate and interposer that can be used for other purposes.

As will be apparent to those skilled in the art, numerous variations may be practiced within the spirit and scope of the invention.

What is claimed is:

1. A power distribution network for distributing power from a package substrate to an interposer comprising:
    a package substrate having first and second major surfaces;
    an interposer having first and second major surfaces with the second major surface of the interposer facing the first major surface of the package substrate but separated therefrom;
    a first copper island on the first major surface of the package substrate;
    a second copper island on the second major surface of the interposer;
    at least one bump between the first and second copper islands, said bump(s) electrically and mechanically connecting the first copper island to the second copper island;
    a plurality of through silicon vias extending between the first and second major surfaces of the interposer; and
    a plurality of leads connecting the through silicon vias to the second copper island.

2. The power distribution network of claim 1 wherein the first copper island is opposite the second copper island when the interposer is mounted on the package substrate.

3. The power distribution network of claim 1 wherein the first copper island is a continuous layer on the first major surface of the package substrate.

4. The power distribution network of claim 1 wherein the second copper island is a continuous layer on the second major surface of the interposer.

5. The power distribution network of claim 1 wherein the first copper island and the second copper island are each continuous layers and the second copper island is substantially coextensive with the first copper island when the interposer is mounted on the package substrate.

6. The power distribution network of claim 1 wherein the plurality of leads connecting the through silicon vias to the

|  | Package | | Interposer | | Die | System Level PDN | | | |
|---|---|---|---|---|---|---|---|---|---|
|  | Balls | Bumps | L (pH) | R (mOhm) | C (nF) | Self Z (Ohm) | Trans Z (Ohm) | Performance | Cost |
| Prior art | 2 | 6 | 0.6 | 11 | 1 | 7.42 | 7.38 | Low | High |
| Invention #1 | 1 | 2 | 12.6 | 220 | 1 | 2.85 | 2.63 | High | Low |
| Invention #2 | 2 | 2 | 12.6 | 220 | 0.5 | 3.19 | 2.98 | High | Low | second copper island extend over a length that is at least five times the distance between the second copper island and the through silicon vias.

7. The power distribution network of claim 6 wherein each lead is a copper trace.

8. The power distribution network of claim 1 wherein there are at least two bumps between the first and second copper islands.

9. The power distribution network of claim 1 wherein the first and second major surfaces of the package substrate are substantially parallel and the first and second major surfaces of the interposer are substantially parallel.

10. The power distribution network of claim 1 further comprising a plurality of microvias that extend from the first copper island into the package substrate wherein at least one microvia forms part of a connection between the first copper island and the second surface of the package substrate.

11. A power distribution network for distributing power from a package substrate to an interposer comprising:
   a package substrate having first and second major surfaces;
   a second substrate having first and second major surfaces with the second major surface of the second substrate facing the first major surface of the package substrate but separated therefrom;
   a first copper island on the first major surface of the package substrate;
   a second copper island on the second major surface of the second substrate;
   at least one bump between the first and second copper islands, said bump(s) electrically and mechanically connecting the first copper island to the second copper island;
   a plurality of through silicon vias extending between the first and second major surfaces of the second substrate; and
   a plurality of leads connecting the through silicon vias to the second copper island.

12. The power distribution network of claim 11 wherein the first copper island is opposite the second copper island when the second substrate is mounted on the package substrate.

13. The power distribution network of claim 11 wherein the first copper island is a continuous layer on the first major surface of the package substrate.

14. The power distribution network of claim 11 wherein the second copper island is a continuous layer on the second major surface of the second substrate.

15. The power distribution network of claim 11 wherein the first copper island and the second copper island are each continuous layers and the second copper island is substantially coextensive with the first copper island when the second substrate is mounted on the package substrate.

16. The power distribution network of claim 11 wherein the plurality of leads connecting the through silicon vias to the second copper island extend over a length that is at least five times the distance between the second copper island and the through silicon vias.

17. The power distribution network of claim 16 wherein each lead is a copper trace.

18. The power distribution network of claim 11 wherein there are at least two bumps between the first and second copper islands.

19. The power distribution network of claim 11 wherein the first and second major surfaces of the package substrate are substantially parallel and the first and second major surfaces of the second substrate are substantially parallel.

20. The power distribution network of claim 11 further comprising a plurality of microvias that extend from the first copper island into the package substrate wherein at least one microvia forms part of a connection between the first copper island and the second surface of the package substrate.

* * * * *